United States Patent
Gupta et al.

(10) Patent No.: US 6,638,886 B1
(45) Date of Patent: *Oct. 28, 2003

(54) PLASMA FLUORINE RESISTANT ALUMINA CERAMIC MATERIAL AND METHOD OF MAKING

(75) Inventors: Anand Gupta, San Jose, CA (US); Tirunelveli S. Ravi, Santa Clara, CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1024 days.

(21) Appl. No.: 09/200,421

(22) Filed: Nov. 23, 1998

Related U.S. Application Data

(62) Division of application No. 08/424,772, filed on Apr. 18, 1995, now Pat. No. 6,083,451.

(51) Int. Cl.[7] .............................................. C04B 35/10
(52) U.S. Cl. ...................................................... 501/127
(58) Field of Search ........................................ 501/127

(56) References Cited

U.S. PATENT DOCUMENTS

| | | | | |
|---|---|---|---|---|
| 4,169,875 A | * | 10/1979 | Laska et al. ............... 264/63 |
| 4,182,972 A | * | 1/1980 | Kaneno et al. ............ 313/221 |
| 4,199,704 A | * | 4/1980 | Varshneya et al. ........ 313/221 |
| 4,396,595 A | * | 8/1983 | Heytmeijer et al. ....... 423/625 |
| 4,762,655 A | * | 8/1988 | Rhodes et al. ............. 264/65 |
| 4,797,238 A | * | 1/1989 | Rhodes et al. ............. 264/65 |
| 5,242,298 A | * | 9/1993 | Sernetz ........................ 433/2 |
| 5,260,011 A | * | 11/1993 | Wolter et al. |
| 5,376,606 A | * | 12/1994 | Kim et al. ................. 501/153 |
| 5,382,556 A | * | 1/1995 | Takahashi et al. ......... 501/105 |
| 5,411,583 A | * | 5/1995 | Bennison et al. .......... 501/119 |
| 5,625,256 A | * | 4/1997 | Tiedt et al. ................ 313/696 |
| 5,631,201 A | * | 5/1997 | Wei et al. .................. 501/152 |
| 5,682,082 A | * | 10/1997 | Wei et al. .................. 501/152 |
| 5,727,975 A | * | 3/1998 | Wei et al. .................... 445/22 |

FOREIGN PATENT DOCUMENTS

| | | | |
|---|---|---|---|
| DE | 2810265 | * | 9/1978 |
| EP | 0115970 | * | 8/1984 |
| EP | 567095 | * | 10/1993 |
| EP | 0708065 | * | 4/1996 |
| JP | 48091112 | * | 11/1973 |
| JP | 57123861 | * | 8/1982 |
| JP | 57129866 | * | 8/1982 |
| JP | 57129867 | * | 8/1982 |
| JP | 01133973 | * | 5/1989 |
| JP | 5217946 | * | 8/1993 |
| JP | 08169755 | * | 7/1996 |
| PL | 145579 | * | 2/1984 |
| PL | 145579 | * | 10/1988 |

OTHER PUBLICATIONS

*Introduction to Ceramics*, Kingery pp. 448–454, 1976.*
*Principles of Ceramic Processing*, Reed, p. 445–452, 1988.*
"Preparation & Characterization of Polycrystalle $Al_2O_3$ w small grain size" Nishida, J Europ. Ceram Soc, 12(3) p. 197–203, (1993).*

* cited by examiner

*Primary Examiner*—Paul Marcantoni
(74) *Attorney, Agent, or Firm*—Shirley L. Church

(57) ABSTRACT

A plasma fluorine resistant polycrystalline alumina ceramic material is produced by forming a green body including alumina and a binder, and sintering the green body for a time from about 8 to 12 hours. The area % of unsintered particles in the polycrystalline alumina ceramic material does not exceed 0.1 area %, resulting in reduced emission of particles from the material after exposure to plasma fluorine.

6 Claims, 3 Drawing Sheets under ambient pressure ("pressureless
PLASMA FLUORINE RESISTANT ALUMINA CERAMIC MATERIAL AND METHOD OF MAKING This application is a divisional application of application Ser. No. 08/424,772, filed Apr. 18, 1995, now U.S. Pat. No. 6,083,451 which is currerntly pending.

BACKGROUND OF THE INVENTION

1. Field of the Invention

The present invention relates to an improved alumina ceramic material which is highly resistant to etching by fluorine plasmas and is characterized by reduced particle emission. The present invention further relates to a method for making the improved ceramic material, and to articles of manufacture comprising the improved ceramic material.

2. Description of the Related Art

Polycrystalline alumina ceramic materials typically are produced by the following sintering process. Powdered alumina, having a desired spectrum of grain sizes (typically having an average size of about 1 $\mu$m to 3 $\mu$m) is combined with a binder, and the combined alumina powder and binder are then compacted to form a green body. Commonly the green body has a composition including about 99.5 wt % alumina and about 0.5 wt % of a mixture of silica, MgO and CaO as a binder. The green body is subsequently sintered, typically in air under ambient pressure ("pressureless sintering") and at a temperature of about 1650° C., for a time of about 4 hours.

During the sintering process, grain growth occurs. For example, common sintering processes yield a distribution of sintered grain sizes ranging from about 1 to about 30 $\mu$m with a mean grain size of about 6 $\mu$m, as determined by well known methods such as those set forth in American Society for Testing and Materials (ASTM) standards E 1181-87 (determination of duplex grain sizes) and E 112-88 (determination of average grain sizes (AGS)). Growth of the alumina grains causes displacement of the binder phase. The displaced binder phase migrates to areas in which smaller grains are present and surround the smaller grains. Since alumina is very immiscible in silica, the primary component of the typical binder phase (see J. W. Welch, Nature, vol. 186, p. 546 et seq. (1960)), the surrounding binder phase prevents further growth of the isolated smaller grains. These isolated unsintered grains can range from about 0.1 to 0.5 $\mu$m in diameter. Typically, about 1% of the alumina grains remain unsintered.

While known polycrystalline alumina ceramic materials have desirable properties, such as high strength and fracture toughness, they have proven insufficiently resistant to certain fluorine plasmas for applications in which exposure to such plasmas is required. Known aluminas are particularly susceptible to etching by fluorine plasmas, such as those generated in chemical vapor deposition (CVD) reactors during chamber cleaning processes. In such processes, plasma fluorine liberated from fluorocarbon and other fluorine-containing gases (for example, $NF_3$ plasmas, $CF_4:O_2$ plasmas and $CF_4:N_2O$ plasmas) are used to remove dielectric film residues deposited in the chambers of the reactors.

Alumina per se is highly resistant to plasma fluorine; thus, sapphire, which is pure single-crystal alumina, is one of the slowest etching materials known.

Etching of polycrystalline alumina ceramic materials occurs primarily in the binder phase. As a result of etching of the binder phase, the small unsintered particles can be dislodged. The dislodged particles can then be emitted from the surface of the ceramic materials. Such polycrystalline alumina ceramic materials constitute a source of contamination when used in CVD reactors and other environments exposed to plasma fluorine.

Solutions to the particle emission problem which have been considered include the production of a polycrystalline alumina ceramic having an increased proportion of alumina, e.g., 99.9 wt % alumina and 0.1 wt % binder; use of a different binder which is less sensitive to fluorine plasma; use of a ceramic material other than alumina; and modification of the initial distribution of alumina grain sizes in the green body.

A particular application in which particle emission is problematic is in the processing of semiconductor wafers in chemical vapor deposition (CVD) systems, for example, in the "5000" apparatus provided by Applied Materials, Inc. as described by Chang et al. in U.S. application Ser. No. 08/136,529. An exemplary prior art CVD reactor is illustrated in FIGS. 1 and 2. In FIG. 1, a CVD system 10 comprises deposition chamber 12, vacuum channel 13, vacuum exhaust system 14, gas inlet means 16, gas distribution shield 17, blocker 18, wafer lift 20, baffle plate 22, lift fingers 24 and susceptor lift 26. A substrate 28, such as a semiconductor wafer, is disposed on a susceptor 30. Heating means 32, for example an external array of 1000 watt lamps directing collimated light through quartz window 36, maintains a uniform processing temperature. The deposition or reaction zone 34 lies above the substrate.

Gas distribution shield 17 is a flat annular element which surrounds blocker 18 and is removably affixed to chamber lid 38 by a plurality of aluminum clips 40, as shown in FIG. 2. Gas distribution shield 17 is typically comprises of a polycrystalline alumina ceramic material.

In a typical deposition process carried out in the illustrated CVD system, process gases (i.e., reaction and carrier gases) enter into the deposition chamber 12 via gas inlet means 16 and "showerhead" type blocker 18. The blocker 18 has numerous openings over an area corresponding to that of the substrate 28 beneath it. The spacing between the.blocker 18 and the substrate 28 can be adjusted to from about 200–1000 mils (5–25 mm) to define the reaction zone 34. The blocker 18 feeds the combined process gases to the reaction zone 34. The deposition reaction is carried out, and the gases are purged from chamber 12. After each wafer is processed, the chamber is cleaned using a cleaning gas such as $NF_3$ or a $C_2F_6/NF_3/O_2$ gas mixture.

When gas distribution shield 17 is comprised of a polycrystalline alumina ceramic material, however, the shield is subject to etching by the cleaning gas or gas mixture as described above, with resultant particle emission. Particles having sizes from about 0.2 to 0.5 $\mu$m can be emitted and can contaminate silicon wafers processed in the CVD apparatus. Particle counts of up to 200/cm$^2$ or higher can be observed on the surfaces of the silicon wafers after 100 wafers have been processed. Such particle counts are unacceptably high.

A continuing need exists for improved polycrystalline alumina ceramic materials and methods for producing them. The materials should show high resistance to plasma fluorine, and in particular show reduced particle emission. A specific need exists for gas distribution shields, for use in a CVD apparatus, which are comprised of such an improved material.

SUMMARY OF THE PREFERRED EMBODIMENTS

In accordance with one aspect of the present invention, there is provided a method of producing a plasma fluorine resistant polycrystalline alumina ceramic material which includes the steps of forming a green body comprising alumina and a binder, and sintering the green body for a time from about 8 to 12 hours.

In accordance with another aspect of the present invention, there is provided a method of producing a plasma fluorine resistant polycrystalline alumina ceramic material which includes the steps of forming a green body comprising alumina and a binder, and sintering the green body for a time such that the area % of unsintered particles in the resulting alumina ceramic material does not exceed 0.1 area %.

In accordance with further aspects of the present invention, there are provided a ceramic material produced according to a method as described above, and an article of manufacture comprising a ceramic material as described above. Preferred embodiments of the inventive articles of manufacture include components useful in vacuum processing devices such as CVD chambers, in particular gas distribution shields.

Other objects, features and advantages of the present invention will become apparent to those skilled in the art from the following detailed description. It is to be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

BRIEF DESCRIPTION OF THE DRAWINGS

The invention may be more readily understood by referring to the accompanying drawings in which.

DETAILED DESCRIPTION OF THE PREFERRED EMBODIMENTS

We have discovered that an alumina ceramic material which is highly resistant to fluorine plasmas can be produced by lengthening the time of firing an alumina green body from the conventional time of about 4 hours to about 8 to 12 hours, without the need for altering the composition of the green body or any other sintering process parameters, such as the sintering temperature, which may affect the sintering mechanism.

The increased sintering time for given sintering temperatures and green body compositions results in a reduction in the percentage of unsintered grains of up to an order of magnitude, i.e., to about 0.1 area % or less, as opposed to about 1 area % for the previously known alumina ceramic materials. The amount of particle emission from the ceramic material upon exposure to plasma fluorine is correspondingly reduced.

A green body which is to be sintered to produce a polycrystalline alumina ceramic material according to the invention can be formed from an alumina powder having any desired composition. Preferred powder compositions include about 99.3 wt % to 99.7 wt % of alumina, and about 0.7 wt % to 0.3 wt % of a binder selected from the group consisting of silica, calcium oxide, magnesium oxide and mixtures thereof. The powder composition can have any conventional distribution of grain sizes.

The selected alumina powder is formed into the green body by means well known to those skilled in the art. The pressure employed to produce the green body preferably ranges from about 5,000 to 14,000 psia, more preferably about 7,000 to 10,000 psia. Initial green body density preferably ranges from about 1.8 to 2.2 g/cm$^3$.

The green body is subsequently sintered for a time from about 8 to 12 hours. Sintering times longer than about 12 hours may result in the formation of second phase crystalline nucleations, thus undesirably altering the structure of the sintered body. Sintering times shorter than about 8 hours do not achieve the desired reduction in the number of unsintered grains and corresponding reduction in particle emission. Sintering times from about 8 to 10 hours are preferred for purposes of process economy.

Preferably, the sintering process is a pressureless sintering process carried out in air. The sintering process can also be carried out in other conventional sintering environments, such as inert gas atmospheres. The sintering process preferably is carried out at a temperature from about 1400° C. to 1700° C., more preferably about 1600° C. to 1650° C. It is emphasized that the invention affords an improved sintering process in which only the length of the sintering time need be changed. All other parameters of the sintering process can remain unchanged.

Figure 1:
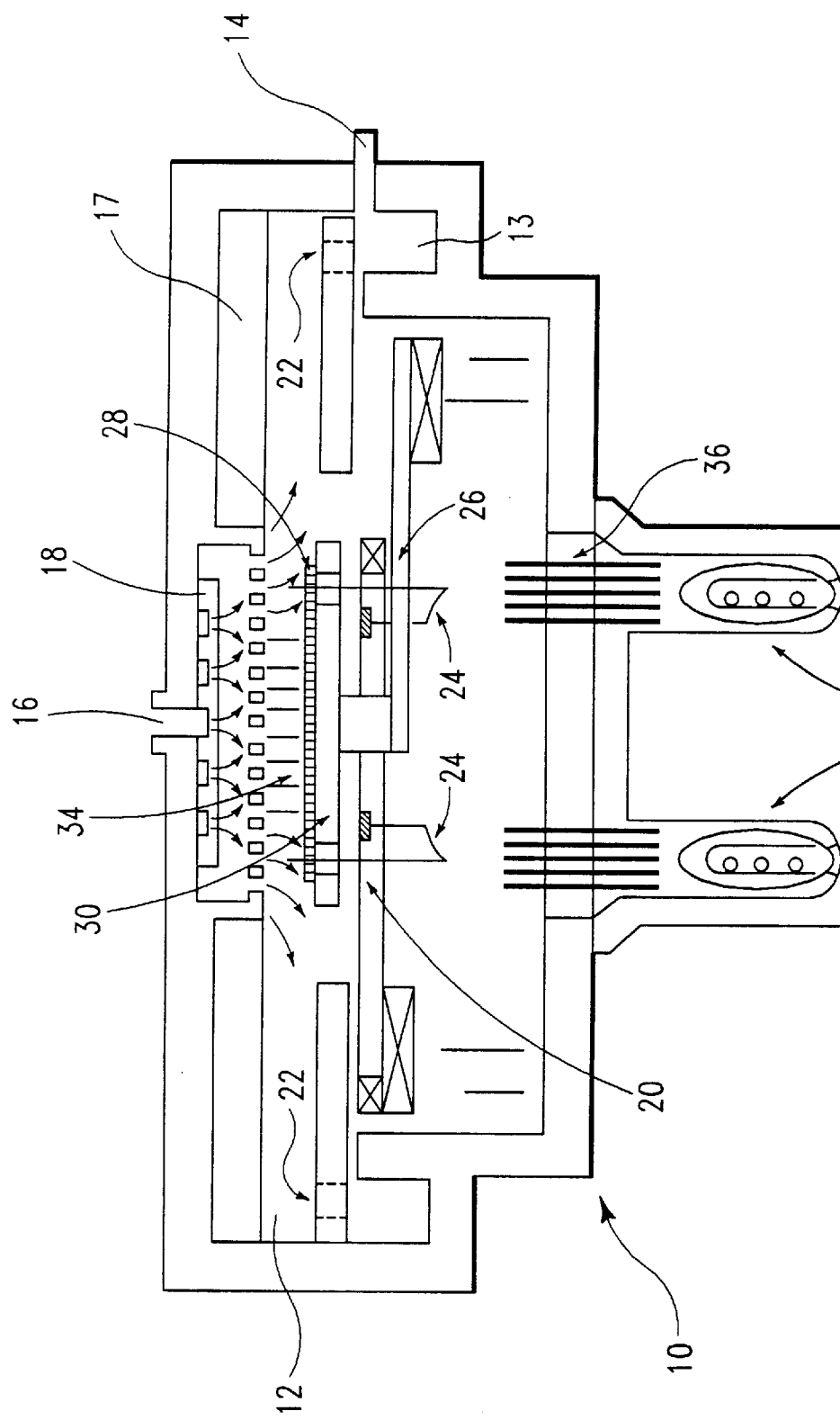
FIG. 1 is a schematic cross-sectional view of a prior art CVD apparatus which employs a gas distribution shield that can be comprised of a polycrystalline alumina ceramic material.
Figure 2:
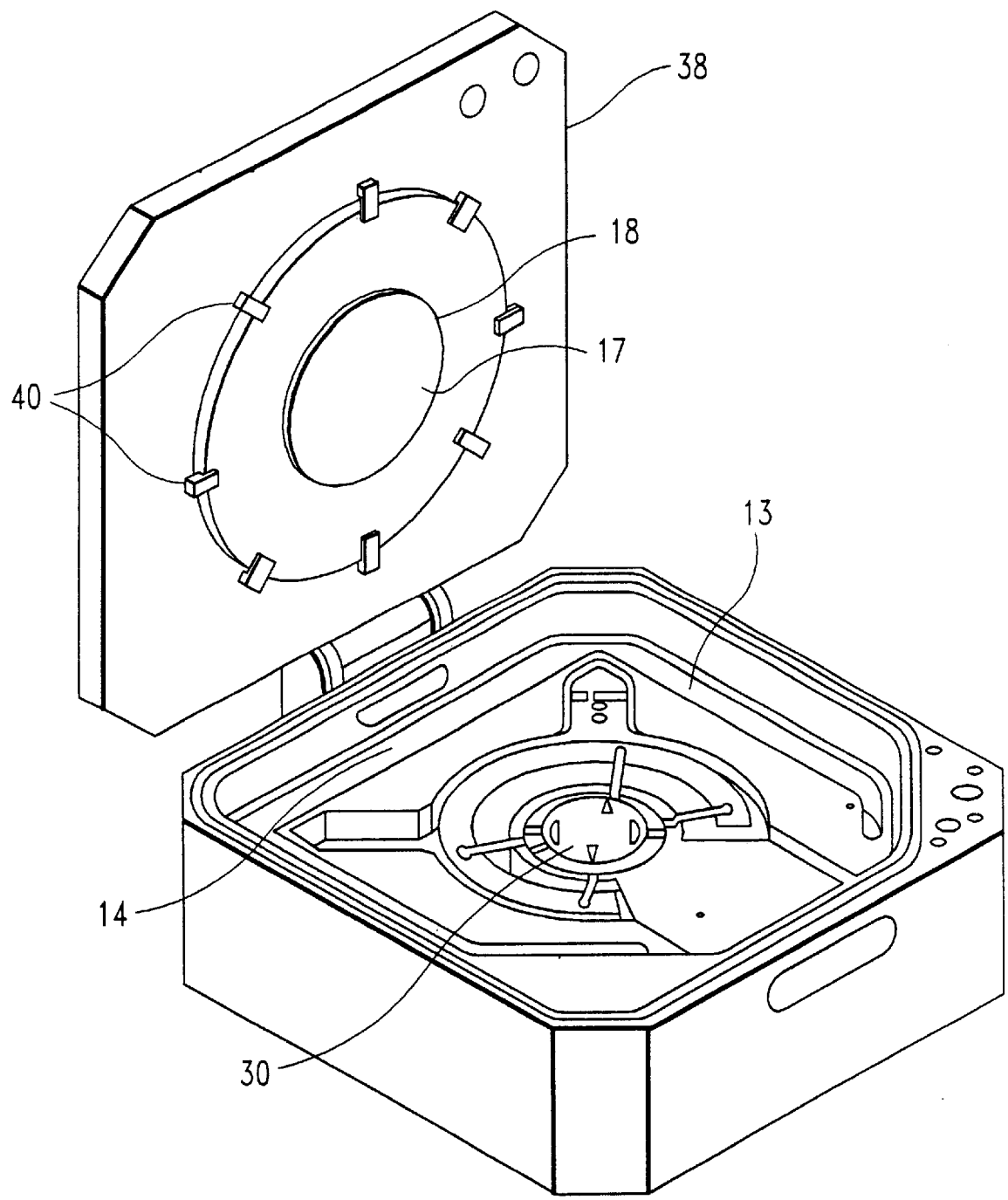
FIG. 2 is a perspective view of the CVD apparatus of FIG. 1 with opened chamber lid, showing the relationship of the gas distribution shield, blocker and chamber lid.
Figure 3:
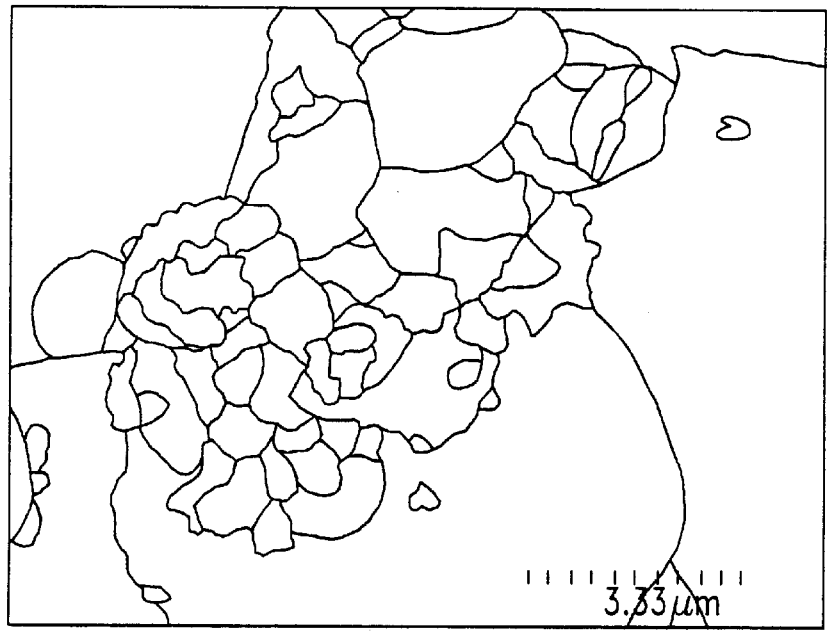
FIG. 3 is a photomicrograph (magnification×9,000) of a polycrystalline alumina ceramic material after a firing time of 4 hours.
Figure 4:
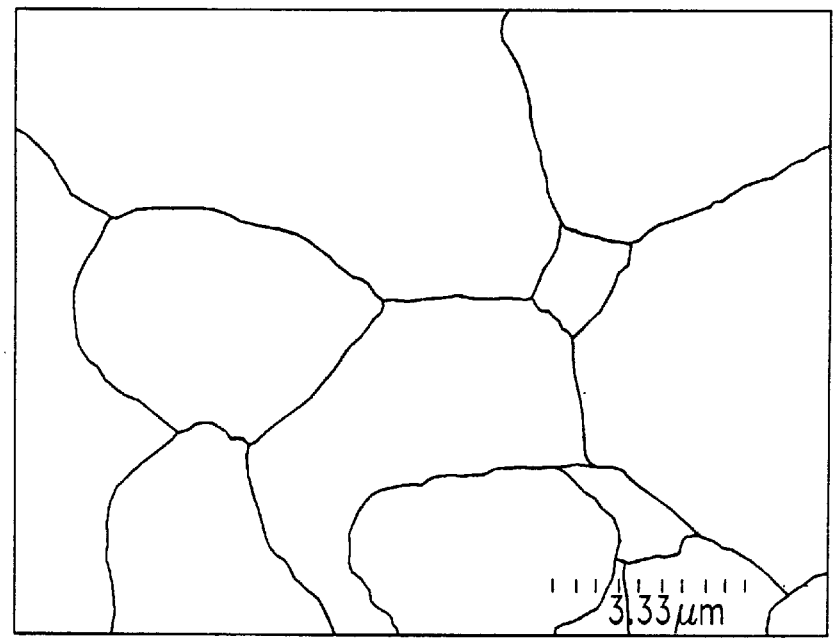
FIG. 4 is a photomicrograph (magnification×9,000) of a polycrystalline alumina ceramic material having the same composition as the material of FIG. 3, after a firing time of 8 hours, illustrating the reduction in the number of unsintered grains achieved according to the invention.

The plasma fluorine resistant alumina ceramic material produced according to the inventive process shows a significant reduction in the quantity of unsintered grains, as is evident from a comparison of the materials illustrated in FIGS. 3 and 4.

As shown in FIG. 3, after a 4 hour soak, there are many particles having a particle size considerably less than 3 μm. As shown in FIG. 4, after an 8 hour soak, the particles typically have sizes ranging from about 3 μm to about 10 μm.

The quantity of unsintered grains can be determined according to methods known to those skilled in the art. In one typical method, a plurality of photomicrographs (e.g., at 10×) of randomly selected regions of the alumina ceramic material are examined, and the presence of unsintered particles are determined by inspection. The areas of the unsintered particles are determined, and the total of the unsintered particle areas is divided by the total area of all of the photomicrographed regions of the alumina ceramic material. The quotient is the area %, and provides a measure of the quantity of unsintered grains.

The alumina ceramic materials produced according to the process of the invention show unsintered grain percentages of about 0.1 area % or less, preferably about 0.01 area % to 0.1 area %.

The particle emission from the alumina ceramic materials of the invention upon exposure to plasma fluorine is correspondingly reduced. Particle contamination of a silicon wafer, for example, due to dislodgment of particles from components of a CVD apparatus comprising the alumina ceramic material after exposure of the material to a fluorine plasma can be quantified using standard techniques. More specifically, particle emission from the alumina ceramic material can be determined by measuring particle counts on the surface of the wafer during a deposition step carried out after CVD chamber cleaning.

According to a typical standard technique, the particle count is determined using a Tencor Surfscan 6200 wafer surface scanner, commercially available from Tencor Instruments Inc. of Mountain View, Calif. The Tencor Surfscan 6200 determines the number of particles on a surface by measuring the amount of light (provided by a 30 mW Ar-ion laser having a wavelength of 488 nm) which is scattered by the particles. The principles of operation of the Tencor Surfscan 6200 and related devices are discussed in *Surface Contamination Detection: An Introduction* (R. Johnson, Ed., Tencor Instruments Inc, Mountain View, Calif. 1990). Other known methods for determining the number of particles on the surface of a material can also be used.

Particle emission from alumina ceramic materials produced in accordance with the inventive process is significantly reduced in comparison to alumina ceramic materials produced according to the corresponding conventional processes, i.e., processes in which sintering times are about 1–4 hours but in which the remaining process parameters and green body compositions are the same. Typically the reduction in particle emission is at least about 50%, preferably at least about 60%, very preferably about 60% to 90%, in comparison to corresponding conventionally produced ceramic materials, as determined by the preferred procedure discussed above.

The inventive process affords a plasma fluorine resistant alumina ceramic material which can be employed in forming a variety of articles of manufacture, preferably for use in environments wherein they are subject to plasma fluorine exposure. Such articles of manufacture include, for example, bell jars, crucibles, and components for use with a vacuum processing apparatus. More specific articles of manufacture within the scope of the instant invention include vacuum processing apparatus components such as a gas distribution shield, a chuck, a nozzle, a susceptor, a heater plate, a clamping ring, a wafer boat, or a chamber wall. Such articles of manufacture can be comprised entirely or substantially of a ceramic material of the invention, or can have one or more surfaces having coatings which comprise a ceramic material of the invention.

Gas distribution shields particularly advantageously include the inventive alumina ceramic material as discussed herein. Such gas distribution shields can be employed in a variety of known devices for processing silicon wafers, as well as other semiconductor materials. Particular known devices in which the foregoing gas distribution shields can be used with advantage include CVD devices provided by Applied Materials, Inc. of Santa Clara, Calif., such as those described by Chang et al. in U.S. application Ser. No. 08/136,529, and by Tseng et al. in U.S. application Ser. No. 08/314,161, the disclosures of each of which are incorporated herein in their entireties by reference. More specific examples include the Precision 5000 CVD reactor (commercially available from Applied Materials, Inc.) The instant invention is further illustrated by reference to the following non-limiting examples.

EXAMPLE 1

An alumina powder (commercially available from Alcoa) was combined with powdered silica, MgO and CaO to afford a composition comprising 99.5 wt % alumina, 0.2 wt % silica, 0.15 wt % MgO and 0.15 wt % CaO. The composition was ball milled to produce a mean particle size of 0.2 $\mu$m. The composition was then compressed to produce green bodies in the form of gas distribution shields having diameters of about 13 inches, with a bore diameter of about 6 inches, thicknesses of 0.25 inch, and densities of 3 g/cm$^3$.

Pressureless sintering of the green bodies according to the invention was carried out in air at 1650° C. for 8 hours nominal sintering time (8 hours actual maintenance at 1650° C.).

The particle emission of each sintered gas distribution shield was then measured. Each shield was installed in a Precision 5000 CVD reactor, and 150 mm (6") diameter silicon wafers were processed in the reactor in which the shield was installed.

Conventional $Si_3N_4$ chemical vapor deposition processes, with chamber cleaning, were carried out in the CVD reactor as follows. A silicon wafer was introduced into the vacuum deposition chamber of the CVD reactor and heated to 400° C. $SiH_4$ (180 sccm), $N_2$ (1800 sccm) and $NH_3$ (75 sccm) were introduced into the chamber, and the chamber pressure was stabilized to 4.5 Torr. A 450 watt plasma was then ignited in the chamber, and deposition was carried out for 1 minute. The chamber was subsequently pumped down to base pressure (100 mTorr), and the wafer was removed.

After the wafer was removed, the chamber was cleaned using a plasma cleaning process. $CF_4$ (1500 sccm) and $N_2O$ (750 sccm) were introduced into the chamber, pressure was stabilized to 5 Torr, and a 750 watt plasma was ignited in the chamber. Plasma cleaning was carried out for 30 seconds. The chamber was subsequently pumped down to base pressure.

Next, the chamber was seasoned by deposition of $Si_3N_4$ in the chamber for 15 seconds. The seasoning step was carried out in the same manner as the deposition step described above.

In a first testing procedure, the seasoning step was carried after every cleaning cycle. In a second testing procedure, the seasoning step was omitted. Prior to and subsequent to CVD deposition, the number of particles having sizes greater than 0.2 $\mu$m on the surfaces of the silicon wafers were counted using a Tencor Surfscan 6200 wafer surface scanner in the manner described herein, and the differences were calculated.

The following results were observed:

|  | Particle count on Si wafer | |
| --- | --- | --- |
| 8 hour sintered shield | with seasoning | without seasoning |
| after 5 wafers | 25–30 | 25–30 |
| after 200 wafers | 25–30 | 25–30 |

EXAMPLE 2

Comparison With Known Process

Green bodies were formed from ball-milled alumina as described above, but were sintered according to a known process in which the nominal sintering time was 4 hours (4 hours actual maintenance at 1650° C.) to form comparison gas distribution shields. All other process conditions were identical to those used in Example 1.

The particle emission of each comparison shield was then measured in exactly the same manner as described in Example 1. The following results were observed:

| 4 hour sintered shield | Particle count on Si wafer | |
|---|---|---|
|  | with seasoning | without seasoning |
| after 5 wafers | 7 | 35 |
| after 200 wafers | 35 | 400 |

Comparison with the results from Example 1 reveals that the shields produced according to the inventive method are characterized by significant improvements in particle emission upon exposure to plasma fluorine. Particle emissions from the inventive shields are both low in number and substantially constant over many wafer processing cycles.

The reduction in particle emission achieved according to the invention is particularly significant in comparison to the known method which does not include a seasoning step. Particle emission from the comparison shields after 200 wafer processing cycles was up to 800% greater than that observed from the inventive shields after the same number of wafer processing cycles.

The inventive material overcomes the difficulties associated with prior art alumina ceramic materials with respect to grain pull-out, is simple to manufacture and provides a medium for inexpensive mass production of vacuum deposition apparatus components, such as gas distribution shields, and other articles of manufacture.

Vacuum deposition apparatus, in particular CVD reactors, which employ components comprising the inventive alumina ceramic material are capable of processing silicon wafers and other materials that show reduced particulate contamination.

What is claimed is:

1. A plasma fluorine resistant polycrystalline alumina ceramic body having less than 0.1 surface area % of unsintered particles and having a mean sintered particle size ranging from about 3 $\mu$m to about 10 $\mu$m produced by the following method:
   (i) forming a green body comprising alumina and a binder; and
   (ii) sintering said green body at a temperature ranging from about 1400° C. to about 1700° C. for a time period ranging from about 8 hours to about 12 hours.

2. The plasma fluorine resistant polycrystalline alumina ceramic body of claim 1, wherein the surface area % of unsintered particles in said polycrystalline alumina ceramic body ranges from about 0.01 surface area % to about 0.1 surface area %.

3. A plasma fluorine resistant polycrystalline alumina ceramic body having less than 0.1 surface area % of unsintered particles and having a mean sintered particle size ranging from about 3 $\mu$m to about 10 $\mu$m produced by the following method:
   (i) forming a green body comprising about 99.3 wt % to about 99.7 wt % of alumina and about 0.7 wt % to about 0.3 wt % of a binder selected from the group consisting of silica, calcium oxide, magnesium oxide and mixtures thereof; and
   (ii) sintering said green body at a temperature ranging from about 1400° C. to about 1700° C. for a time period ranging from about 8 hours to about 12 hours.

4. A plasma fluorine resistant polycrystalline alumina ceramic body comprising about 99.3 wt % to about 99.7 wt % of alumina and about 0.7 wt % to about 0.3 wt % of a binder selected from the group consisting of silica, calcium oxide, magnesium oxide and mixtures thereof, wherein said polycrystalline ceramic body has a mean sintered particle size ranging from about 3 $\mu$m to about 10 $\mu$m . and wherein the surface area % of unsintered particles in said polycrystalline alumina ceramic body does not exceed 0.1 surface area %.

5. A plasma fluorine resistant polycrystalline alumina ceramic body having less than 0.1 surface area % of unsintered particles and having a mean sintered particle size ranging from about 3 $\mu$m to about 10 $\mu$m produced by the following method:
   (i) providing a starting composition comprising alumina and a binder;
   (ii) comminuting said starting composition to produce an intermediate composition having a mean particle size of about 0.2 $\mu$m;
   (iii) forming a green body comprising said intermediate composition; and
   (iv) sintering said green body at a temperature ranging from about 1400° C. to about 1700° C. for a time period ranging from about 8 hours to about 12 hours.

6. The plasma fluorine resistant polycrystalline alumina ceramic body of claim 5, wherein said starting composition comprises about 99.3 wt % to about 99.7 wt % of alumina and about 0.7 wt % to about 0.3 wt % of a binder selected from the group consisting of silica, calcium oxide, magnesium oxide and mixtures thereof.

* * * * *